United States Patent
Lippert et al.

(10) Patent No.: US 7,515,438 B2
(45) Date of Patent: Apr. 7, 2009

(54) SYSTEMS AND METHODS FOR IMPLEMENTING SUBCRIBER IDENTITY MODULES

(75) Inventors: Kurt J. Lippert, Austin, TX (US); Johnny C. Fraga, Round Rock, TX (US); Luc D. Truong, Austin, TX (US)

(73) Assignee: Dell Products L. P., Round Rock, TX (US)

(*) Notice: Subject to any disclaimer, the term of this patent is extended or adjusted under 35 U.S.C. 154(b) by 407 days.

(21) Appl. No.: 11/294,282

(22) Filed: Dec. 5, 2005

(65) Prior Publication Data

US 2007/0127220 A1    Jun. 7, 2007

(51) Int. Cl.
 *H04B 1/03* (2006.01)
(52) U.S. Cl. ....................... 361/814; 361/679
(58) Field of Classification Search ............... 361/814, 361/679, 800, 818, 816, 792
 See application file for complete search history.

(56) References Cited

U.S. PATENT DOCUMENTS

| | | | | |
|---|---|---|---|---|
| 5,574,625 A | * | 11/1996 | Ohgami et al. | 361/684 |
| 5,831,256 A | * | 11/1998 | De Larminat et al. | 235/486 |
| 6,230,002 B1 | | 5/2001 | Floden et al. | |
| 6,244,894 B1 | * | 6/2001 | Miyashita | 439/500 |
| 6,305,960 B1 | | 10/2001 | Fan | |
| 6,424,118 B1 | * | 7/2002 | Tu | 320/115 |
| 6,455,188 B1 | * | 9/2002 | McKay et al. | 429/97 |
| 6,602,096 B1 | | 8/2003 | Kronestedt et al. | |
| 6,724,616 B2 | * | 4/2004 | Kuo et al. | 361/683 |
| 6,724,618 B1 | | 4/2004 | Jenkins et al. | |
| 6,837,439 B2 | * | 1/2005 | Kitchen | 235/492 |
| 6,942,153 B1 | * | 9/2005 | Yuan et al. | 235/472.01 |
| 7,172,454 B2 | * | 2/2007 | Karkkainen et al. | 439/492 |
| 2002/0160661 A1 | | 10/2002 | Florescu | |
| 2003/0048605 A1 | * | 3/2003 | Kyozuka et al. | 361/686 |
| 2004/0052059 A1 | * | 3/2004 | Chang | 361/736 |
| 2004/0089570 A1 | * | 5/2004 | Chien et al. | 206/320 |
| 2005/0116685 A1 | * | 6/2005 | Liu et al. | 320/116 |

FOREIGN PATENT DOCUMENTS

| | | |
|---|---|---|
| EP | 1180814 A2 | 2/2002 |
| EP | 1180814 A3 | 3/2002 |
| WO | WO99/52338 | 10/1999 |
| WO | WO00/76282 | 12/2000 |
| WO | WO02/37703 A1 | 5/2002 |
| WO | WO02/089039 A1 | 11/2002 |

OTHER PUBLICATIONS

Wikipedia, "Build To Order", Printed from Internet Dec. 21, 2008, 2 pgs.

* cited by examiner

*Primary Examiner*—Hung S Bui
(74) *Attorney, Agent, or Firm*—O'Keefe, Egan, Peterman & Enders LLP (57) ABSTRACT

Systems and methods for providing a SIM module for an information handling system, such as desktop computer, notebook computer or other type of portable information handling system, etc. An information handling system may be assembled so that a SIM module need only be installed into the information handling system when SIM functionality is required to support a GSM type WWAN card, and not installed when such WWAN capability is not needed.

13 Claims, 5 Drawing Sheets

SYSTEMS AND METHODS FOR IMPLEMENTING SUBCRIBER IDENTITY MODULES

FIELD OF THE INVENTION

This invention relates generally to subscriber identity modules (SIMs) and, more particularly, to SIM systems configured for information handling systems and methods of assembling same, e.g., in a build to order environment.

BACKGROUND OF THE INVENTION

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are often configured as portable devices. One popular type of portable information handling system is a notebook computer. As wireless communications become more prevalent in our society, offering an integrated wireless wide area network (WWAN) solution in a notebook computer is a logical progression. While this feature is highly desirable, the adoption rate of WWAN capability in notebook computers will likely be small, i.e., less than about 5% of new notebook computers will likely be configured with WWAN capability when it is initially offered. Components to support WWAN capability in a notebook computer add to the overall cost of the notebook computer. For example, a specific Global System for Mobile communication GSM (HEDGE) type WWAN card requires installation of a SIM card socket to support SIM smart card functionality. At the present time, this socket and associated electrostatic discharge (ESD) protection components add cost to the assembly, but are only needed when a notebook computer is configured with the GSM type WWAN card.

It is known to provide a motherboard of a notebook computer with a video card connector capable of interconnecting with a mating connector of more than one type of video card that may be specified by a notebook computer customer. During assembly of the notebook computer, a video card corresponding to the particular type of video card specified by a customer order for the notebook computer is selected and assembled to the notebook computer motherboard by interconnecting the motherboard connector and the mating connector of the video card.

SUMMARY OF THE INVENTION

Disclosed herein are systems and methods for providing a SIM module for an information handling system, such as desktop computer or notebook computer, personal data assistant (PDA) or other type of portable information handling system, etc. In one embodiment, the disclosed systems and methods may be implemented during the assembly of an information handling system so that a SIM module need only be installed into the information handling system when SIM functionality is required to support a GSM type WWAN card, and not installed when such WWAN capability is not needed. In this way, a build to order assembly method may be provided in one exemplary embodiment so that the extra costs associated with a SIM socket connector and support components are only incurred by those information handling system customers who desire this feature, and not by those customers who do not. Since it is expected at least initially that most information handling system customers will not order a information handling system having WWAN capability, the disclosed systems and methods may be advantageously implemented so that the majority of customers who do not want this WWAN feature will not be burdened by the extra cost of this feature.

The disclosed systems and methods may be implemented in a build to order environment, for example, to fulfill orders for information handling systems that are received from purchasers or other entities via telephone, via electronic information medium (e.g., via computer network such as the Internet), etc. In such a build to order embodiment, order information may be received by an information handling system supplier or manufacturer from a retail or wholesale customer, user, or other entity. The order information may specify desired features or options for an information handling system, e.g., such as a notebook computer. Such features or options may sometimes include GSM WWAN capability, requiring that the particular information handling system be built with SIM functionality. When order information specifies GSM capability, the supplier or manufacturer may fulfill such an order by building an information handling system that includes a SIM module (i.e., including SIM socket connector and optional associated circuitry) by using the methodology and components described further herein. For each other order received for the same type of information handling system that has order information that does not specify GSM WWAN capability, the supplier or manufacturer may fulfill the order by building the same configuration of information handling system, with the exception that the SIM module is not provided or assembled as part of the information handling system.

For example, in one exemplary online ordering embodiment the retail or wholesale customer, user or other entity may select information handling system features or options, including GSM WWAN capability or SIM functionality, online via a graphical user interface (GUI) menu provided on personal computer or other type of information handling system. These selected features or options may be communicated as order information across the Internet or other computer network to a server or other suitable network entity that receives the order information and provides it to a fabricator or systems integrator that assembles the information handling system in accordance with the order information. In another exemplary embodiment, the retail or wholesale customer, user or other entity may communicate selected information handling system features or options orally via telephone to a sales representative, who may enter the selected information handling system features or options into a computer workstation or other type of information handling system for communication to a server or other suitable network entity that receives the order information and provides it to a fabricator or systems integrator that assembles the information handling system in accordance with the order information. It will be understood that the foregoing examples are exemplary only, and that the disclosed systems and methods may be implemented in build to order environments in which order information is communicated to a fabricator or systems integrator in any other suitable way (e.g., via physical mail order, via in-store order, etc.).

In one exemplary embodiment of the disclosed systems and methods, a SIM module system may be provided that includes a SIM socket connector, associated circuitry such as ESD protection components, and a connector mounted on a printed circuit board (PCB). Using this configuration, a SIM module system may be provided (e.g., as a daughterboard assembly) that is configured to, electrically couple in signal communication with circuitry of a motherboard and/or other circuit board assembly (e.g., another daughterboard) of an information handling system, such as a notebook computer. For example, a SIM module may include a daughterboard assembly that is configured to electrically couple to a motherboard assembly via one or more board-to-board connectors between the SIM module and the motherboard assembly, or may be configured to electrically couple to a second daughterboard assembly via one or more board-to-board connectors between the SIM module and the second daughterboard assembly. In the latter case, the second daughterboard assembly may in turn electrically couple to a separate motherboard assembly via one or more board-to-board connectors between the second daughterboard assembly and the motherboard assembly. Alternatively, a SIM module may be configured to electrically couple with a motherboard or other circuit board assembly in any other suitable manner, e.g., using conductor cables connected between the SIM module and the motherboard or other circuit board assembly.

A SIM module may be provided in one exemplary embodiment that is configured to electrically couple in signal communication with any type of motherboard assembly that itself is configured to include one or more basic circuitry components of an information handling system, e.g., microprocessor/s, coprocessor/s, one or more system buses, BIOS, memory, etc. A motherboard may be a PCB or any other suitable substrate or assembly that itself includes interconnecting circuitry and one or more sockets or other suitable mechanism for connection with daughterboard/s, plug-in card/s, processor/s, memory module/s, peripheral device/s, etc. Examples of motherboard configurations include, but are not limited to, IBM AT motherboard configuration, IBM ATX motherboard configuration, etc.

In the practice of one embodiment of the disclosed systems and methods, a SIM module may be mechanically fastened in board-to-board relationship with a motherboard or other circuit board assembly (e.g., daughterboard), for example, using a plurality of fasteners, such as a plurality of screws or other suitable fasteners, adhesives, etc. Alternatively, a SIM module may be assembled without fasteners in board-to-board relationship with a motherboard or other circuit board assembly using board-to-board connection (e.g., board-to-board connectors) between the motherboard or other circuit board assembly that also serves to electrically couple the SIM module to the motherboard or other circuit board assembly. In yet another alternative embodiment, a SIM module may be electrically coupled to a motherboard or other circuit board assembly using conductor cable/s, with or without board-to-board assembly of the SIM module to the motherboard or other circuit board assembly.

During assembly, a SIM module may be selectively assembled into a information handling system depending on whether or not GSM WWAN capability is desired for the assembled system, e.g., whether or not an order to build or assemble the information handling system includes order information that specifies that the system is to be provided with GSM WWAN capability or otherwise specifies inclusion of a SIM module system in the assembled system. If a given system is to be assembled with WWAN capability, then the SIM module system may be placed into the information handling system in any suitable manner, e.g., through an opening provided in the battery compartment of a portable information handling system such as notebook computer. However, if GSM capability is not desired for the given system, then the system may be assembled by simply omitting the step of placing the SIM module system into the information handling system. In this way, multiple motherboard configurations are not required to support build-to-order assembly of GSM and non-GSM WWAN capable information handling systems, e.g., a single motherboard configuration may be employed to assemble both GSM and non-GSM capable information handling system systems by selectively assembling a SIM module system to the motherboard of an information handling system only when GSM capability is desired for a given system, e.g., only when an order for assembly of an information handling system includes order information that specifies GSM capability.

In one respect, disclosed herein is a method of assembling an information handling system, including: providing a first circuit board assembly for the information handling system; and electrically coupling a subscriber identity module (SIM) module system to the first circuit board assembly. The SIM module system may include a SIM socket connector adaptor and a SIM socket connector coupled to the SIM socket connector adaptor.

In another respect, disclosed herein is an information handling system, including: a first circuit board assembly; and a subscriber identity module (SIM) module system electrically coupled to the first circuit board assembly. The SIM module system may include a SIM socket connector adaptor and a SIM socket connector coupled to the SIM socket connector adaptor.

In another respect, disclosed herein is a SIM module system including a SIM socket connector adaptor and a SIM socket connector coupled to the SIM socket connector adaptor.

DESCRIPTION OF ILLUSTRATIVE EMBODIMENTS

Figure 1:
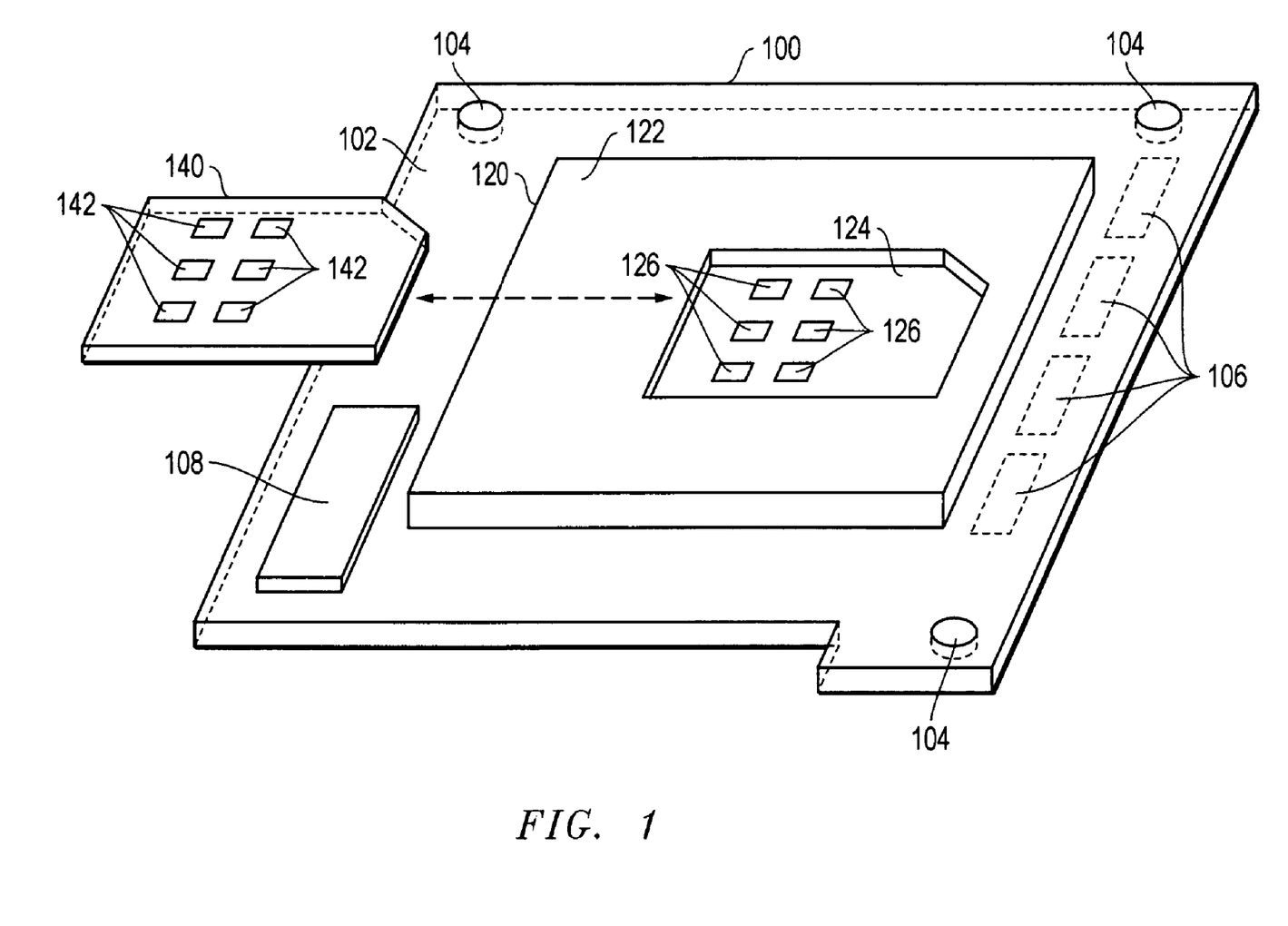
FIG. 1 is a perspective view of a SIM module system and associated SIM card according to one exemplary embodiment of the disclosed systems and methods.

FIG. 1 illustrates one exemplary embodiment of a SIM module system 100 and associated SIM card 140 (e.g., SIM mini-card) as they may be configured according to one exemplary embodiment of the disclosed systems and methods. As shown in FIG. 1, SIM module system 100 includes a SIM socket connector 120 mounted on a SIM socket connector adaptor 102. SIM socket connector 120 includes a connector body 122 in which a cavity 124 is defined for removably receiving SIM card 140. Contact members 126 (e.g., spring contacts) are provided within cavity 124 for electrical mating with corresponding contact surfaces 142 (e.g., pads) provided on the underside of SIM card 140 when SIM card 140 is received within cavity 124. SIM card 140, contact members 126 and contact surfaces 142 may be configured and dimensioned, for example, according to international standard specifications for GSM communications (e.g., European Telecommunications Standards Institute, ETSI), or may be of any other configuration and/or dimensions as desired or needed to meet the characteristics of a given application.

Still referring to FIG. 1, SIM socket connector 120 is mechanically and electrically coupled to a first side of SIM socket connector adaptor 102 which may be, for example, a printed circuit board (PCB) daughterboard configured for attachment and electrical mating with a motherboard of a portable information system such as notebook computer. As shown, SIM socket connector adaptor 102 may include optional associated circuitry 108, such as ESD circuitry components, that may be integrated or otherwise attached to SIM socket connector adaptor 102 and operatively coupled to contact members 126 for electronic operation with SIM card 140. Associated circuitry 108 may additionally and/or alternatively include any other type of circuitry components configured for electronic operation with SIM card 140.

In the illustrated embodiment of FIG. 1, SIM socket connector adaptor 102 also includes connector structures 106 (e.g., board to board connectors) configured for electrical connection to corresponding connector structures (e.g., motherboard connector structures) of a portable information handling system. Within SIM module system 100, connector structures 106 may be in turn operatively coupled to contact members 126 and associated circuitry 108. In addition, one or more fastener openings 104 may be provided for receiving optional fasteners (e.g., screws, rivets, etc.) that may be employed in one embodiment to mechanically fasten SIM module system 100 to a motherboard of a portable information handling system, such as notebook computer.

Figure 2A:
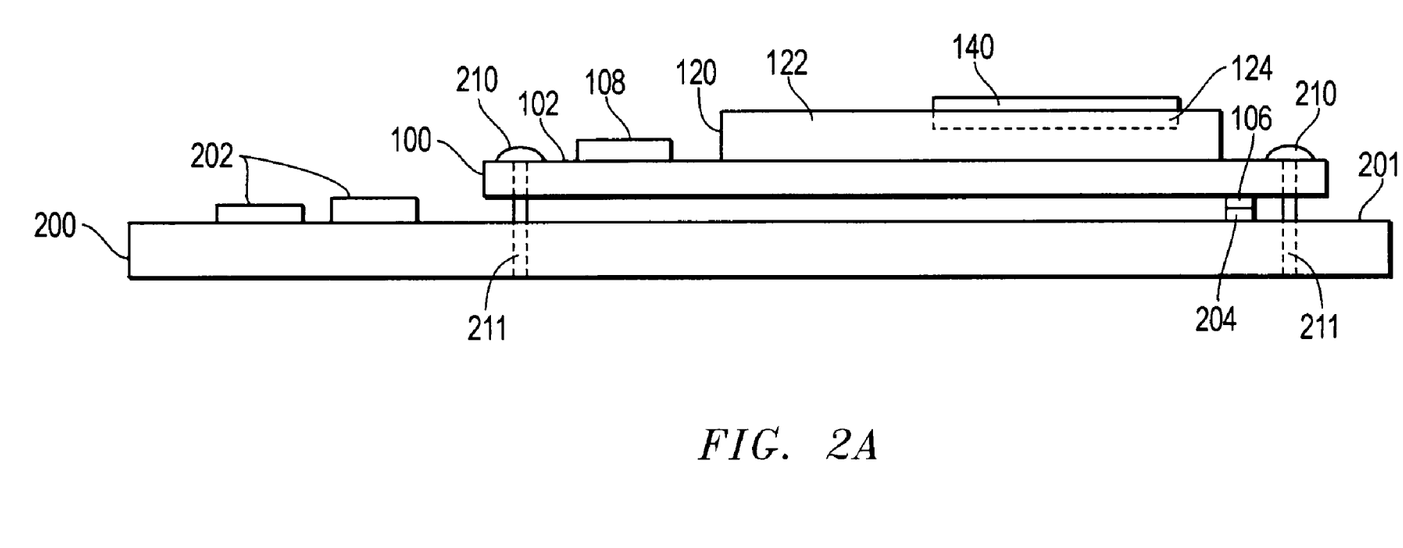
FIG. 2A is a side view of a SIM module system and motherboard according to one exemplary embodiment of the disclosed systems and methods.

FIG. 2A is a side view of a SIM module system 100 as it may be mechanically fastened and electrically coupled in signal communication to a motherboard 200 of a portable information handling system (e.g., such as a notebook computer) in one exemplary embodiment. As shown in the exemplary embodiment of FIG. 2A, motherboard 200 has a connection surface 201 that includes connector structures 204. In this exemplary embodiment, SIM socket connector adaptor 102 is mechanically assembled in board-to-board relationship with motherboard 200 using fasteners 210 received in fastener openings 211, and so that connector structures 106 (e.g., board-to-board connectors) make electrical contact with corresponding connector structures 204 (e.g., board-to-board connectors) of motherboard 200 in order to electrically couple circuitry of SIM module system 100 with circuitry of motherboard 200. Such circuitry may include, for example, GSM radio transceiver circuitry, radio antenna circuitry, etc. provided for an information handling system, such as desktop computer or notebook computer, PDA or other type of portable information handling system.

Figure 2B:
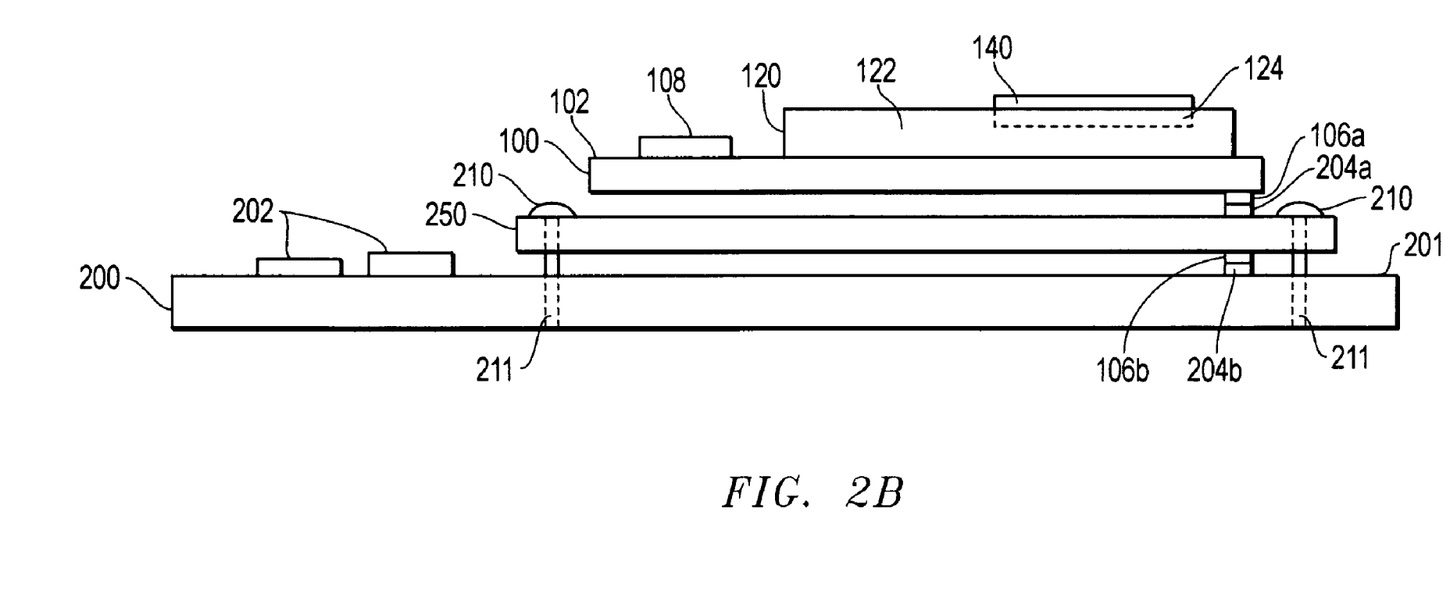
FIG. 2B is a side view of a SIM module system, second daughterboard and motherboard according to one exemplary embodiment of the disclosed systems and methods.
Figure 2C:
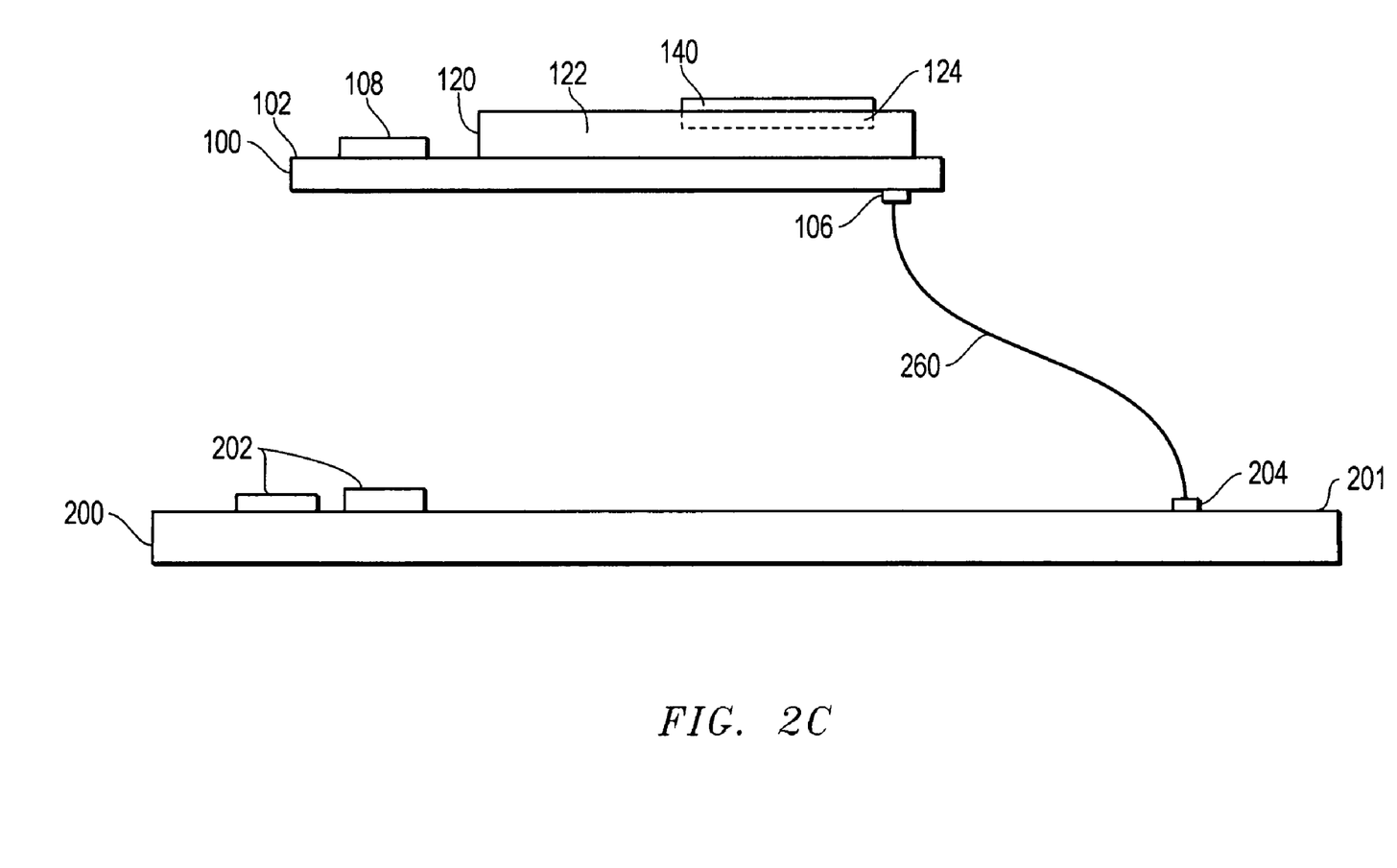
FIG. 2C is a side view of a SIM module system and separated motherboard according to one exemplary embodiment of the disclosed systems and methods.

It will be understood that FIG. 2A is exemplary only and that use of fasteners 210 is not required, as shown in FIG. 2B where SIM module 100 is electrically coupled without fasteners to second daughterboard 250 that in the illustrated embodiment intervenes between SIM module 100 and motherboard 200. Furthermore, it will be understood that a board-to-board mechanical relationship between SIM module 100 and motherboard 200 is not required in order for electrical coupling between SIM module 100 and motherboard 200 to be provided, e.g., such as when conductor cables 260 are used to electrically couple SIM module 100 and separated or remotely located motherboard 200 as shown in FIG. 2C.

It will be understood that the SIM module system embodiment of FIGS. 1 and 2A, 2B and 2C is exemplary only and that any other configuration of SIM socket connector suitable for receiving a SIM card in combination with a SIM socket connector adaptor suitable for coupling SIM socket connector and other optional circuitry to a motherboard or other circuit board assembly may be employed in the practice of the disclosed systems and methods.

Figure 3:
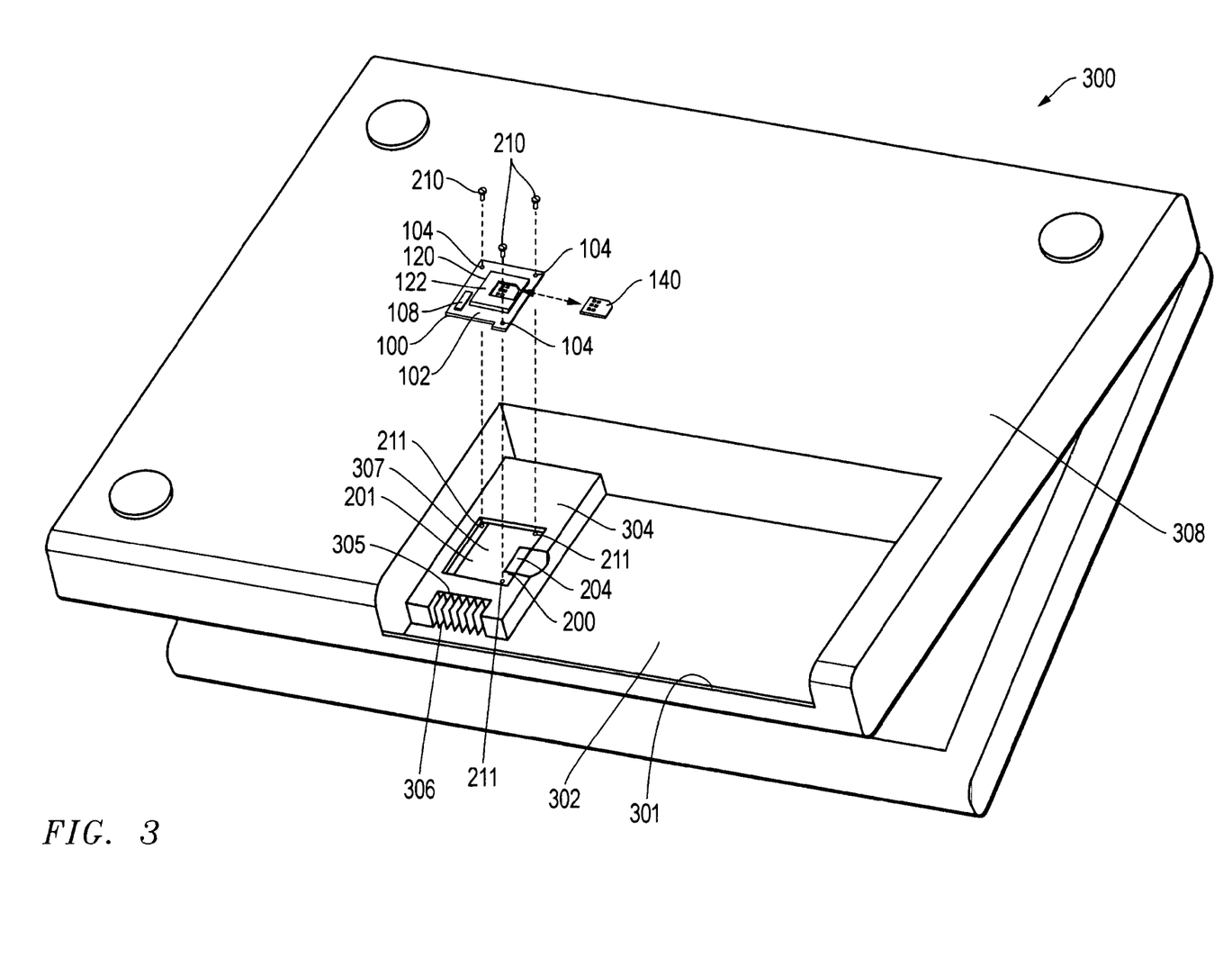
FIG. 3 is an exploded perspective view of a portable information handling system as it may be configured according to one exemplary embodiment of the disclosed systems and methods.

FIG. 3 illustrates a portable information handling system as it may be configured as a notebook computer 300 according to one exemplary embodiment of the disclosed systems and methods. As shown, notebook computer 300 includes an external housing 301. FIG. 3 also shows an opening 302 defined in a surface 308 (e.g., bottom or underside surface) of external housing 301 of notebook computer 300. In this embodiment, opening 302 forms a battery compartment to house a battery pack and various circuitry components of portable information handling system 300, including motherboard 200 and optional motherboard housing 304 that partially covers connector surface 201 of motherboard 200. In one exemplary embodiment, motherboard housing 304 may be integrally formed as part of external housing 301 of notebook computer 300.

As further shown in FIG. 3, motherboard housing 304 has a battery connector opening 305 defined in order to expose battery connector 306 for connection to a battery pack when it is inserted into battery compartment opening 302. Motherboard housing 304 also has a SIM module opening 307 provided for receiving SIM socket connector adaptor 102 (e.g., daughterboard) of SIM module system 100, which may be mechanically assembled to motherboard 200 via fasteners 210 that may be received in fastener openings 211. In this exemplary embodiment, SIM module system 100 may be accessed through battery compartment opening 302, (e.g., by removing a compartment cover) and, as shown by double-sided arrow in FIG. 3, SIM card 140 may be removably inserted into cavity 124 of SIM module system 100. It will be understood that the SIM module system configuration of FIG. 3 is exemplary only, and that an information handling system may be provided with a SIM module system using any other suitable alternative configuration.

Still referring to the exemplary embodiment of FIG. 3, SIM module system 100 may be selectively assembled (e.g., as part of a build-to-order assembly method) into portable information handling system 300, e.g., depending on whether or not GSM WWAN capability or presence of SIM module system is otherwise specified in order information received in connection with an order for the assembled system 300. If the presence of a SIM module system is not specified for system 300, then components of SIM module system 100 (e.g., SIM socket connector 120 and associated circuitry components 108) need not be assembled to motherboard 200, saving SIM module-related component costs when these components are not needed or desired, and allowing a build-to-order assembly method to be implemented using a common motherboard configuration for both GSM and non-GSM capable information handling systems. Among other things, a common motherboard configuration may advantageously be employed to reduce the complexity of the assembly method and the number of parts that must be designed and kept on hand for assembly of different information handling systems when using build to order methodology.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. An information handling system, comprising:
    a first circuit board assembly; and
    a subscriber identity module (SIM) module system electrically coupled to said first circuit board assembly with a conductor cable, said first circuit board being remotely located from said SIM module system and said first circuit board not having a board to board mechanical relationship with said SIM module system;
    wherein said SIM module system comprises a SIM socket connector adaptor and a SIM socket connector coupled to said SIM socket connector adaptor;
    wherein said first circuit board assembly comprises a motherboard;
    wherein said portable information handling system comprises a notebook computer; and
    wherein said notebook computer comprises an external housing and a battery compartment opening defined in a surface of said external housing of said notebook computer, said battery compartment opening being dimensioned to house a battery pack and said motherboard; and wherein said SIM module system is electrically coupled to said motherboard through said battery compartment.

2. The information handling system of claim 1, wherein said SIM socket connector adaptor comprises a printed circuit board (PCB); and wherein said SIM socket connector adaptor further comprises electrostatic discharge (ESD) protection circuitry.

3. The information handling system of claim 1, wherein connectors of said SIM socket connector adaptor are electrically coupled by said conductor cable to corresponding connector structures of said motherboard to electrically couple circuitry said SIM module system to circuitry of said motherboard.

4. The information handling system of claim 1, wherein said notebook computer further comprises a motherboard housing that partially covers a connector surface of said motherboard, said motherboard housing comprising an opening defined therein adjacent said connector surface; wherein said motherboard housing opening is configured to receive said conductor cable for assembly to said connector surface of said motherboard to electrically couple said SIM module system to said motherboard.

5. A method of assembling an information handling system, comprising:
    providing a first circuit board assembly for said information handling system; and
    electrically coupling a subscriber identity module (SIM) module system to said first circuit board assembly;
    wherein said SIM module system comprises a SIM socket connector adaptor and a SIM socket connector coupled to said SIM socket connector adaptor; and
    wherein said information handling system comprises an external housing and a battery compartment opening defined in a surface of said external housing of said information handling system, said battery compartment opening being dimensioned to house a battery pack and said first circuit board assembly; and wherein said method further comprises assembling said SIM module system in board to board relationship to said first circuit board assembly through said battery compartment opening.

6. The method of claim 5, wherein said first circuit board assembly comprises a motherboard; wherein said information handling system comprises a motherboard housing that partially covers a connector surface of said motherboard, said motherboard housing comprising a SIM module opening defined in said motherboard housing adjacent said connector surface and said SIM module opening being dimensioned to removably receive said SIM socket connector adaptor; and wherein said method further comprises assembling said SIM socket connector adaptor in board to board relationship to said connector surface of said motherboard through said battery compartment opening and through said SIM module opening defined in said motherboard housing.

7. The method of claim 6, wherein said information handling system comprises a first information handling system; and wherein said method comprises a build to order assembly method for said first information handling system, said build to order assembly method comprising:
    receiving first order information from a customer that represents a specified configuration for said first information handling system that includes a SIM module system, and assembling said subscriber identity module (SIM) module system in board-to-board relationship with said motherboard of said first information handling system in response to said received first order information; and receiving second order information from a customer that represents a specified configuration for a second information handling system that does not include a SIM module system, and not assembling a subscriber identity module (SIM) module system to a motherboard of said second information handling system in response to said second order information.

8. The method of claim 7, wherein said first and second order information are each received from a retail or wholesale customer; wherein said first order information specifies GSM capability; wherein said second order information does not specify GSM capability; wherein each of said first and second order information is communicated to a fabricator or systems integrator; and wherein fabricator or systems integrator assembles said first information handling system with said subscriber identity module (SIM) module system in accordance with said first order information and assembles said second information handling system without said subscriber identity module (SIM) module system in accordance with said second order information.

9. The method of claim 8, wherein each of said first and second order information includes features selected by a retail or wholesale customer via a graphical user interface (GUI) menu; and wherein said first and second order information are each communicated across the Internet to a server that receives the first and second order information and then provides it to said fabricator or systems integrator.

10. The method of claim 6, wherein said first and second information handling systems each comprise notebook computers.

11. An information handling system, comprising:
a first circuit board assembly; and
a subscriber identity module (SIM) module system electrically coupled to said first circuit board assembly;
wherein said SIM module system comprises a SIM socket connector adaptor and a SIM socket connector coupled to said SIM socket connector adaptor; and
wherein said information handling system comprises an external housing and a battery compartment opening defined in a surface of said external housing of said information handling system, said battery compartment opening being dimensioned to house a battery pack and said first circuit board assembly; and wherein said SIM module system is assembled in board-to-board relationship to said first circuit board assembly through said battery compartment opening.

12. The system of claim 11, wherein said first circuit board assembly comprises a motherboard; wherein said information handling system comprises a motherboard housing that partially covers a connector surface of said motherboard, said motherboard housing comprising a SIM module opening defined in said motherboard housing adjacent said connector surface and said SIM module opening being dimensioned to removably receive said SIM socket connector adaptor; and wherein said motherboard housing opening is configured to receive said SIM socket connector adaptor for board to board assembly to said connector surface of said motherboard through said battery compartment opening.

13. The system of claim 12, wherein said information handling system comprises a notebook computer.

* * * * *